United States Patent
Lee

(10) Patent No.: US 7,923,272 B2
(45) Date of Patent: Apr. 12, 2011

(54) METHOD OF FORMING A RESIN COVER LENS OF LED ASSEMBLY

(75) Inventor: Hwang-Pao Lee, Chu-Pei (TW)

(73) Assignee: Hwang-Pao Lee, Hsin-Chiu (TW)

( * ) Notice: Subject to any disclaimer, the term of this patent is extended or adjusted under 35 U.S.C. 154(b) by 183 days.

(21) Appl. No.: 12/003,657

(22) Filed: Dec. 28, 2007

(65) Prior Publication Data

US 2010/0041169 A1     Feb. 18, 2010

(51) Int. Cl.
  *H01L 21/00*    (2006.01)
(52) U.S. Cl. .................. 438/28; 257/E33.067
(58) Field of Classification Search .................. 257/100, 257/E33.059, E33.067; 438/16, 28, 29, 25, 438/22, 34, 106, 116
  See application file for complete search history.

(56) References Cited

U.S. PATENT DOCUMENTS

| | | | | |
|---|---|---|---|---|
| 6,140,438 A | * | 10/2000 | Ojio et al. | 526/264 |
| 2004/0014397 A1 | * | 1/2004 | Tyldesley | 451/29 |
| 2006/0017860 A1 | * | 1/2006 | Adachi et al. | 349/1 |
| 2008/0079182 A1 | * | 4/2008 | Thompson et al. | 264/1.9 |

* cited by examiner

*Primary Examiner* — Thomas L Dickey
*Assistant Examiner* — Nikolay Yushin
(74) *Attorney, Agent, or Firm* — Muncy, Geissler, Olds & Lowe, PLLC

(57) ABSTRACT

A method of forming the resin cover lens of LED assembly uses transparent materials, such as plastics, PP (Polypropylene), PET (Polyethylene teraphthalate), PC (Polycarbonate), PE (Polyethylene) or glass to produce the mold for making lens; and uses liquid transparent resin that can be quickly cured under EB (electron-beam) radiation, such as PU (Polyurethane), epoxy, silicon, acrylic resin or its copolymer et al., or the above resin added with photo initiator and curable under UV radiation; and fills in the mold cavity with the resin; and selects EB or UV to cure the liquid transparent resin inside the cavity to form lens. The new process in the invention is to reduce the curing time for making lens that helps LED assembly achieve high throughput rate and mass production.

7 Claims, 3 Drawing Sheets

METHOD OF FORMING A RESIN COVER LENS OF LED ASSEMBLY

BACKGROUND OF THE INVENTION

The invention is related to a method of forming the resin cover lens of LED assembly, and more particularly to a transparent material is used as the mold for forming the resin cover lens of LED assembly, so electron-beam (EB) or ultraviolet ray (UV) can pass through the transparent mold and quickly cure the resin materials into lens.

Traditional light emitting diode assembly (abbreviated to LED assembly) can be designed with various assembly structures according to application or structural requirements, such as Taiwan Patent Nos. M297481, M294096, 1246787, 1246779, M283326, M283312, M281294, M268724, M297046, M294808, M291602, M291085, M289908, M289521, M288974, M288005, M287503, 200629598, 200628727, 200629598, 200635085, 200414558 and U.S. Patent Pub. No. US2006/0105485A1 et al. As in FIG. 1, a traditional LED assembly 1 mainly comprises: one base 10 to support LED chip 11 and electrically connect LED chip 11 to light LED chip with external power source; one or several LED chips 11 to light with external power source; and one or multiple layers of resin cover lens 12 made of transparent resins to cover the base 10 and LED chip 11 and make the base 10 and LED chip 11 into a LED assembly 1, and also make LED chip 11 to light through the resin cover lens 12 outward; wherein the cover lens 12 are usually made of transparent or light permissive resins and located on the supporting plane of the base and able to cover the LED chip, forming a LED assembly structure. Further, the LED assembly can be designed with cover lens of different properties, i.e. the cover lens can be designed into different structure or lighting mode, such as using phosphor substance in resin to generate white light or designing different surface patterns to form different lighting patterns, or designing inner, outer or multiple-layer lens.

A normal method of forming a LED assembly is as follows: providing a molding tool with cavity in the shape of the cover lens; having the cavity face up and fill in liquid transparent resin, usually PU (Polyurethane), epoxy, silicon, acrylic resin, copolymer, to form the lens; placing the LED chip or the electrically connected LED chip and base at the entry of the mold cavity, so the supporting plane of the base and the LED chip can be partially or completely soaked into the liquid transparent resin, i.e. the liquid transparent resin can coat the supporting plane of the base and the surface of the LED chip; heating up the mold and the resin inside, for example, in the oven, to thermally cure the resin; then taking out the entire article from the mold to complete the LED assembly process. However, the mold in a traditional method of forming the LED assembly is usually made of metal, which does not have light transparency, so only the liquid transparent resin at the cavity entry is exposed to a limited extent. Moreover, the LED chip or its combination with the base is located with other tools at the cavity entry could cover some of the limited exposure area, so the exposure are a of the liquid transparent resin is further decreased, which makes it difficult for EB or UV radiation to cure the resin. Thus, a traditional LED assembly process would place the mold filled with the liquid transparent resin in an oven, such as baking at 120° C. for one hour or above. The entire curing process is lengthy and hinders the mass production of LED assembly.

SUMMARY OF THE INVENTION

The main objective of the invention is to provide the method of forming a resin cover lens of LED assembly It provides a fast method of forming the resin cover lens of LED assembly and comprises the following steps: using transparent materials, such as PP (Polypropylene), PET (Polyethylene teraphthalate), PC (Polycarbonate), PE (Polyethylene) or non-plastic material, like glass et al., to produce a mold for forming the cover lens; selecting the resins for the cover lens, such as PU (Polyurethane), epoxy, silicon, acrylic resin or copolymer et al., which can be quickly cured under EB (electron-beam) radiation, or add photoinitiators to the previous materials, so they will be quickly cured under UV (ultraviolet ray) radiation; filling the resin into the mold; exposing the filled mold to EB or UV to quickly cure the resin inside and form the cover lens; therefore, it can accelerate the curing process or effectively reduce the curing time, and high throughput rate and mass production can be achieved for LED assembly.

Another objective for the invention is to provide a method of forming the resin cover lens of LED assembly, wherein the mold c an further have several cavities for producing several cover lens at a time. This will meet the process requirement for manufacturing LED assembly and save equipment cost for EB or UV, and also help achieve the mass production of LED assembly.

The invention mainly uses transparent or light-permissive mold, and cures the resin in the mold with UV or EB to produce various kinds of lens for LED assembly. The produced lens include lens with various properties. The invention is suitable for all traditional processes for manufacturing LED assembly, such as LED unit or several LED as array, such as LED car lighting pattern, and various LED assembly structures, like LED assembly with lens of different layers of properties, such as phosphor to form white light; besides, the lens can be designed with different surface patterns for producing different lighting patterns. The invention can replace the lengthy curing operation in a traditional LED assembly process, such as baking at 120° C. for one hour or above to facilitate mass production of LED.

DETAILED DESCRIPTION OF THE PREFERRED EMBODIMENT

Refer to FIG. 2, FIG. 3 and FIG. 4, the invention is mainly to provide a fast method of forming the resin cover lens 12 of LED assembly 1 as shown in FIG. 1. The method consists of the following steps:

Step (1): provide a transparent mold 2;
Step (2): select the liquid transparent resin 3 (3a) for making the lens;
Step (3): fill the liquid resin 3 (3a) into cavity 20 of the mold 2;
Step (4): use EB 41 radiation or UV 51 radiation from EB or UV equipment to pass through the mold 2 and cure the transparent resin 3 (3a) to form cover lens 12;
Step (5): remove the resin cover lens 12 from the mold 2.

In step (1), it uses transparent material to make the mold 2 for producing the cover lens 12. The transparent material can be plastics, such as PP (Polypropylene), PET (Polyethylene teraphthalate), PC (Polycarbonate), PE (Polyethylene) or non-plastics, such as glass, et al. The transparent materials have sufficient light transmission and hardness. The way to make the mold 2 is not restricted. It can be through precision injection molding, compression molding or precision machine processing. By any means, the mold cavity 20 matches the shape of the resin cover lens 12. The design for the mold 2 is also not restricted. It can be one mold 2 with a multiple of cavities 20 for producing the resin cover lens 12, as shown in FIG. 2 and FIG. 3. This will facilitate mass production. Further, the layout of the multiple cavities 20 is not restricted and can vary with the structure, process or equipment for manufacturing LED assembly 1. Thus, it will save cost for EB or UV equipment and also help achieve the mass production of LED assembly.

In step (2), the liquid transparent resin 3 can be PU (Polyurethane), epoxy, silicon), acrylic resin or its copolymers et al. In general, the above resin 3 will be cured quickly under EB radiation, which can be generated by EB equipment 4. Further, the resin 3 can also be added with photoinitiator uniformly to become resin 3a, which will be cured quickly under UV radiation. The photoinitiator, upon UV radiation, release free radicals to initiate the curing of the resin 3a. UV radiation can be generated by UV equipment 5. In practice, the use of liquid transparent resin 3 or 3a, and the use of EB equipment 4 or UV equipment 5 are determined by the manufacturer. This offers the manufacturer with flexibility and convenience.

In step (3), usually LED assembly manufacturers design different processes and equipment with different LED assembly structure. A normal resin cover lens 12 process starts with electrically connecting LED chip 11 and base 10, followed by placing the combination through a tool (or carrier) 6 at the cavity 20 entry, as shown in FIG. 3. So the supporting plane of base 10 and the LED chip 11 can be completely or partially immersed into the liquid transparent resin 3 (3a), i.e. the liquid resin 3 (3a) can completely or partially coat the supporting plane of the base 10 and the LED chip 11 surface. With different process, the tool (carrier) 6 can be designed differently. Further, the LED chip 11 is not necessarily to electrically connect the base 10 first.

The invention is to provide a fast method of forming the resin cover lens 12 of LED assembly 1. Due to the transparent mold 2, the surface around the cavity 20 can all be exposed to EB 41 or UV 51 radiation, i.e. EB 41 or UV 51 can almost completely reach the entire liquid resin 3 (3a) in the cavity. Therefore, it will accelerate the curing process of the resin 3 (3a) and effectively reduce the curing time. This will also eliminate the lengthy process in a normal forming process that requires to bake the mold at 120° C. for one hour or above. Thus, the invention helps achieve mass production of LED assembly.

Figure 1:
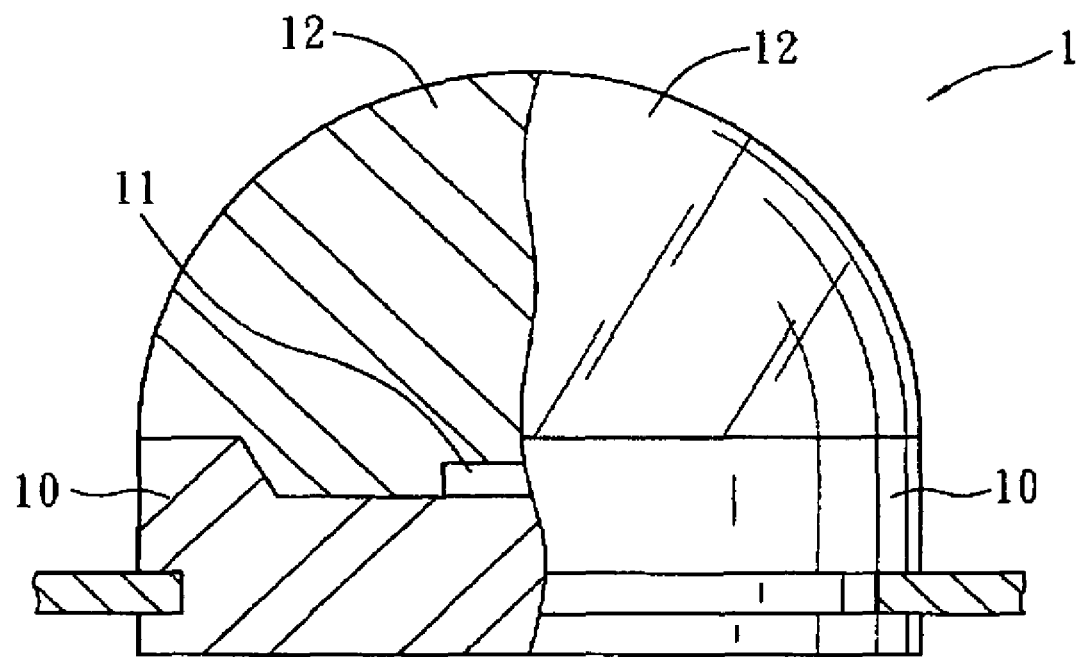
FIG. 1: a side view for a traditional LED assembly.
Figure 2:
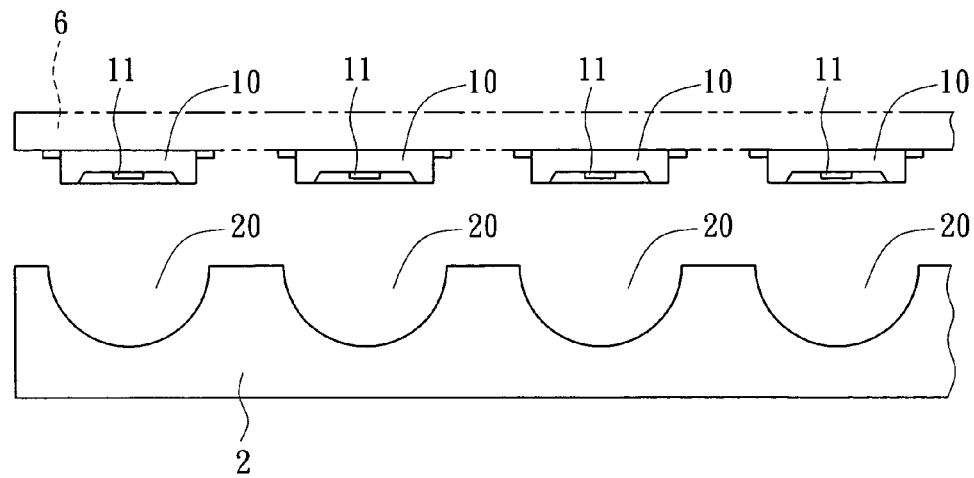
FIG. 2: an illustration for a liquid transparent resin before it fills into a mold cavity for the invention.
Figure 3:
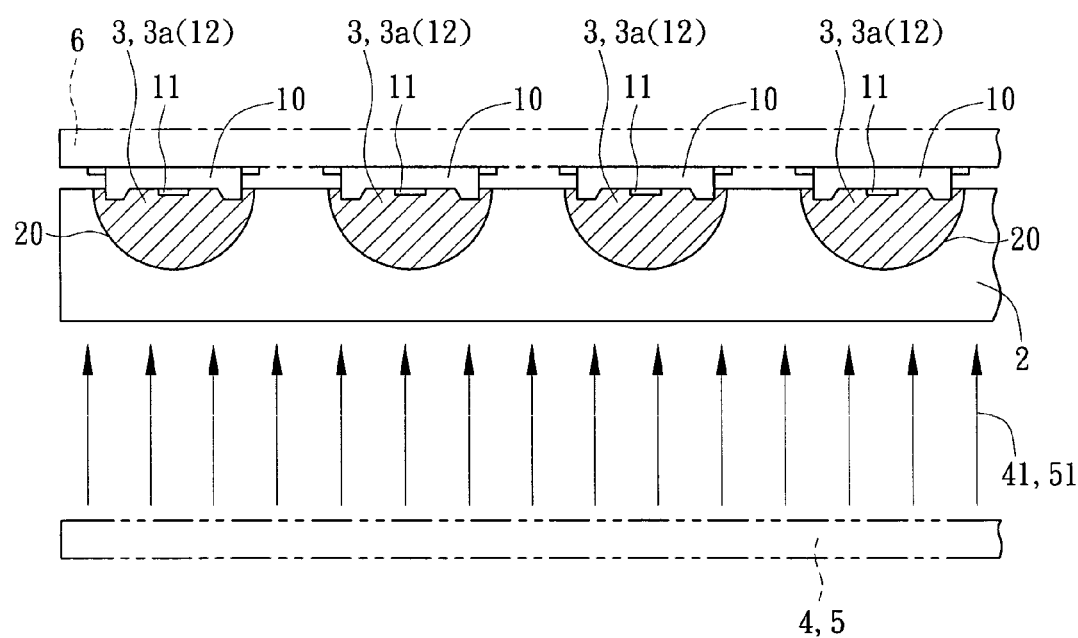
FIG. 3: an illustration for a liquid transparent resin after it fills into a mold cavity for the invention.
Figure 4:
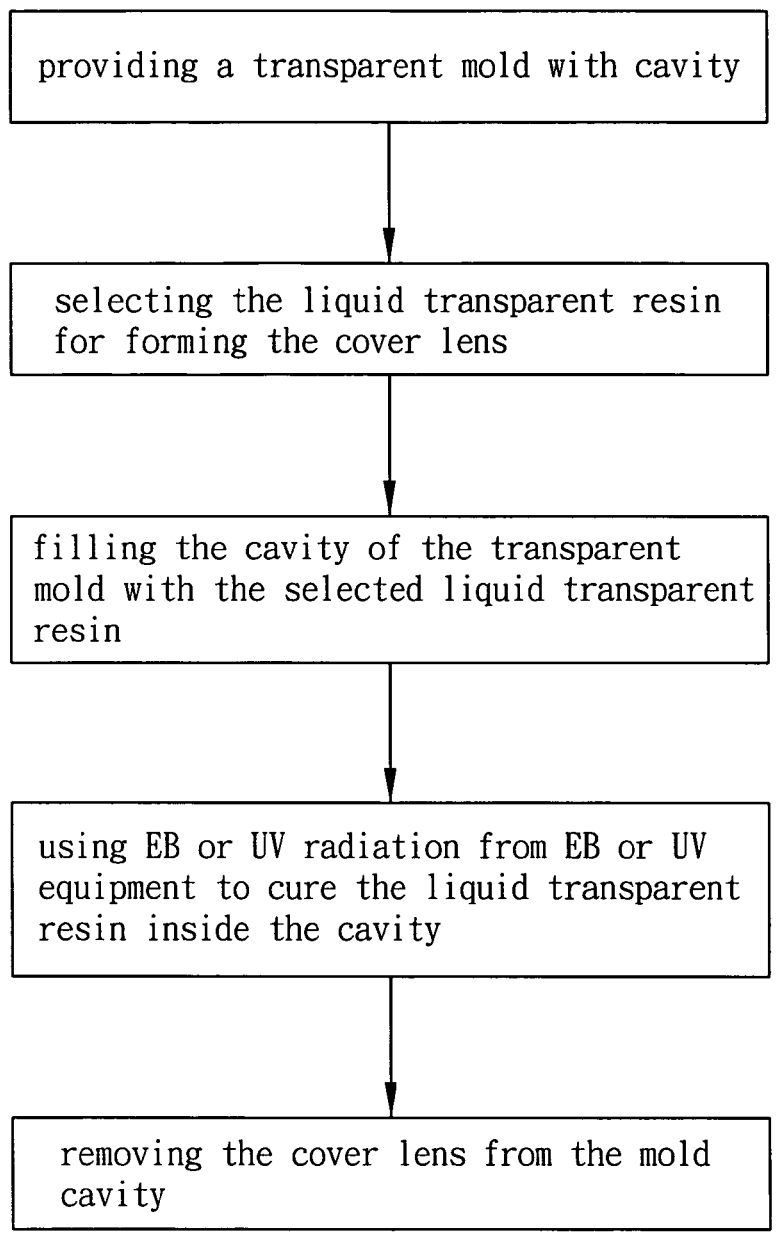
FIG. 4: a block diagram for the forming process for an embodiment in the invention.

What is claimed is:

1. A method of forming the resin cover lens of LED assembly, said LED assembly including a base supporting one or multiple LED chip, and the LED chip emitting light while connected with external power source, one or multiple layers of cover lens made of transparent resin covering the base and the LED chip to make the light emitted by the LED chip pass through the cover lens and emit outward, said method comprising:
   providing a transparent mold with multiple cavities for forming the cover lens, wherein said transparent mold is made of a transparent material selected from the group of transparent PP (Polypropylene), transparent PET (Polyethylene teraphthalate), transparent PE (Polyethylene) and transparent glass, and wherein the entry of each cavity is in the same horizontal plane and in an upward direction;
   selecting the liquid transparent resin for forming the cover lens;
   filling the cavities of the transparent mold with the selected liquid transparent resin;
   placing each of the combination of the LED chip and the base through a tool downwards at each cavity entry to make the supporting plane of the base and the LED chip completely or partially immersed into the liquid transparent resin so as to have the liquid resin completely or partially covering the supporting plane of the base and the LED chip surface;
   using an electron bean (EB) or UV radiation emitted upwards from EB or UV equipment arranged under the transparent mold to cure upwards the liquid transparent resin inside the cavities; and
   removing the cover lens from the mold cavity.

2. A method of forming the resin cover lens of LED assembly as claimed in claim 1, wherein said liquid transparent resin is disposed on PU (Polyurethane), epoxy, silicon, acrylic resin or its copolymer.

3. The method of forming the resin cover lens of LED assembly as claimed in claim 2, the liquid transparent resin is cured by EB (electron-beam) radiation.

4. The method of forming the resin cover lens of LED assembly as claimed in claim 2, wherein said liquid transparent resin is well mixed with photoinitiator uniformly and then cured under UV (ultraviolet ray) radiation.

5. The method of forming the resin cover lens of LED assembly as claimed in claim 1, wherein the cavities of the transparent mold are filled with only one of the selected liquid transparent resins.

6. The method of forming the resin cover lens of LED assembly as claimed in claim 5, wherein the curing of the liquid transparent resin is done in a single step.

7. The method of forming the resin cover lens of LED assembly as claimed in claim 1, wherein the curing of the liquid transparent resin is done in a single step.

* * * * *